(12) United States Patent
Rupp et al.

(10) Patent No.: US 6,784,571 B2
(45) Date of Patent: Aug. 31, 2004

(54) ELECTRONIC SAFETY SWITCHING DEVICE AND METHOD

(75) Inventors: Roland Rupp, Hattenhofen (DE); Hans Schwenkel, Stuttgart (DE)

(73) Assignee: Pilz GmbH & Co., Ostfildern (DE)

( * ) Notice: Subject to any disclaimer, the term of this patent is extended or adjusted under 35 U.S.C. 154(b) by 0 days.

(21) Appl. No.: 10/414,795

(22) Filed: Apr. 16, 2003

(65) Prior Publication Data

US 2003/0178961 A1 Sep. 25, 2003

Related U.S. Application Data

(63) Continuation of application No. PCT/EP01/11436, filed on Oct. 4, 2001.

(30) Foreign Application Priority Data

Oct. 30, 2000 (DE) .......................................... 100 53 820

(51) Int. Cl.[7] ............................................. B60Q 11/00
(52) U.S. Cl. ........................ 307/326; 307/327; 307/328; 361/189
(58) Field of Search ................................ 307/326, 327, 307/328; 361/189

(56) References Cited

U.S. PATENT DOCUMENTS

| 5,526,264 | A | 6/1996 | Niggemann et al. |
| 5,862,502 | A | 1/1999 | Giers |
| 6,201,997 | B1 | 3/2001 | Giers |
| 6,246,318 | B1 | 6/2001 | Veil et al. |

FOREIGN PATENT DOCUMENTS

| DE | 41 22 016 A1 | 1/1993 |
| DE | 197 07 241 C2 | 5/2000 |

*Primary Examiner*—Robert L Deberadinis
(74) *Attorney, Agent, or Firm*—Harness, Dickey & Pierce, P.L.C.

(57) ABSTRACT

The present invention relates to an electronic safety switching device having at least a first and a second signal processing channel. The channels can be supplied with input signals for signal processing, and they provide redundantly processed output signals. According to one aspect of the invention, the signal processing channels are arranged monolithically on a common semiconductor substrate. The semiconductor structures of each signal processing channel are spaced apart physically by a multiple of their width from the semiconductor structures of every other signal processing channel.

19 Claims, 1 Drawing Sheet

ELECTRONIC SAFETY SWITCHING DEVICE AND METHOD

CROSS-REFERENCES TO RELATED APPLICATIONS

This application is a continuation of copending international patent application PCT/EP01/11436 filed on Oct. 4, 2001 designating the U.S. and published in German language, which PCT application claims priority from German patent application DE 100 53 820.7, filed on Oct. 30, 2000.

BACKGROUND OF THE INVENTION

The present invention relates to an electronic safety switching device having at least a first and a second signal processing channel and to a corresponding method of switching off an industrial machine. The first and second signal processing channels can be supplied with input signals for signal processing, and they provide processed output signals. The invention particularly relates to such a device and method, wherein the first and second signal processing channel process the input signals redundantly with respect to each other, and wherein the first and second signal processing channels each are constructed using integrated semiconductor structures.

Safety switching devices of this type are primarily used in the industrial sector in order to carry out shutdown operations on machines, plants and other installations in a failsafe manner. In this connection, the term "failsafe" means that the switching device meets standardized requirements regarding failsafety, in particular the requirements of safety category 3 of the European Standard EN 954-1 or higher. Devices of this type are used, for example, to stop a machine plant, such as a press or an automatically operating robot, as a reaction to the operation of an emergency off pushbutton or the opening of a protective door, or to transfer the installation in another way into a nonhazardous state. Likewise, it is generally necessary to switch off a machine or machine plant at least partly to carry out maintenance or commissioning work. Since a malfunction or failure of the safety switching device would result in an immediate hazard to human personnel in such a situation, very high requirements are placed on safety switching devices with regard to their failsafe nature. As a rule, safety switching devices may therefore be used in the industrial sector only after appropriate approval by a responsible inspecting authority, for example professional associations or governmental authorities.

One measure of achieving the required failsafe nature is to construct the safety switching device redundantly with a plurality of channels, the at least two signal processing channels monitoring each other. If a fault occurs in one of the signal processing channels, the second signal processing channel should be capable of recognizing this and arranging for a nonhazardous state for persons in the area of the machine plant. During this procedure, particular attention must be placed on possible fault causes which influence a plurality of the redundant signal processing channels in the same way, since otherwise the requisite failsafe nature is not ensured (what is known as common cause faults).

A procedure which is often practised during the approval of safety switching devices by the responsible inspecting authorities is that the designer or manufacturer of the safety switching device has to present a thoroughgoing and detailed consideration of faults, in which every conceivable fault is covered. In this document, it is necessary to prove that the safety switching device can bring about a nonhazardous state for persons in a reliable manner even when the respective fault occurs. A consideration of this type is very complicated, in particular in the case of complex safety switching devices having numerous functions, which has a detrimental effect on the costs of the development and manufacture. Added to this is the fact that this fault assessment has to be repeated even in the case of slight changes to the construction or in the structure of the safety switching device since, for example, new fault sources can be produced merely as a result of a physically different arrangement of intrinsically identical components.

SUMMARY OF THE INVENTION

In view of this, it is an object of the present invention to specify a safety switching device of the type mentioned at the beginning in which the effort to demonstrate the failsafe nature is reduced.

It is another object of the invention to provide a safety switching device and method that can be implemented at lower cost.

According to one aspect of the invention, these objects are achieved by the first and the second signal processing channel being arranged monolithically on a common semiconductor substrate, the semiconductor structures of each signal processing channel being spaced apart physically by a multiple of their width from the semiconductor structures of every other signal processing channel.

Thus, a safety switching device is proposed in which the mutually redundant signal processing channels are arranged jointly in one semiconductor chip for the first time. In this case, it is not ruled out that each of the signal processing channels will further be supplemented with the aid of external components, for example for setting time constants, depending on the type and the functionality of the safety switching device. However, the advantages of the invention have a greater effect the fewer additional external components are needed.

As a result of the common arrangement of the redundant signal processing channels, the entire structure of the safety switching device can be defined, during the design and development of the semiconductor chip, in a form which can subsequently no longer be changed. As a result of this, the error consideration required for the approval by the inspecting authorities only has to be carried out once, namely during the development of the semiconductor chip. Subsequent checks can be restricted to checking in quantitative terms compliance with the specifications defined during the development of the semiconductor chip, in particular compliance with envisaged physical dimensions and materials used. Checks of this type can be carried out substantially more simply than the complicated prior art fault assessments.

Furthermore, the new approach has the advantage that, because of the unchanging nature of the semiconductor chip after its manufacture, specific fault causes can reliably be ruled out from the beginning. For example, during a fault assessment a short circuit between two conductor tracks on the semiconductor substrate can be ruled out if the two conductor ends maintain a sufficient distance from each other. In contrast, for example, a short circuit as a result of mechanical crushing could arise in operation between two conductor cables which are insulated from each other in a conventional manner known per se.

Furthermore, the new approach has the advantage that the recognized, tried and trusted methods of carrying out a fault assessment can be applied in the same way as hitherto, which, not least, also makes acceptance by the responsible inspecting authorities easier. Because of the unchanging nature of the semiconductor chip, it is in particular possible to transfer those methods which are recognised in the fault assessment of printed circuit boards.

Furthermore, the measure according to the invention has the advantage that a semiconductor chip can be accommodated in a manner known per se and with tried and tested manufacturing methods in a dust-tight housing, which substantially minimizes fault causes arising from industrial contamination. Fault causes of this type can therefore likewise be ruled out during the fault assessment to be carried out.

Furthermore, the safety switching device according to the invention can be fabricated very efficiently in very large numbers, without additional fault causes being created in this way. Not least, the safety switching device according to the invention can be miniaturized very highly, owing to the measure proposed, which enlarges the field of use and the possible uses considerably.

In a refinement of the invention, the first and the second signal processing channel each have at least one communication interface for mutual internal data interchange.

As an alternative to this, it would also be possible to connect the redundant signal processing channels to each other externally, that is to say outside the semiconductor substrate, for mutual data interchange. In contrast, the preferred measure has the advantage that the fault assessment relating to mutual data interchange likewise has to be carried out only once during the development of the semiconductor chip. Furthermore, the internal data interchange is possible more quickly and more freely of disruptive environmental influences. Finally, fault causes during the installation of the safety switching device according to the invention are reduced.

In a further refinement, the communication interfaces of the first and second signal processing channel are connected to each other via at least two physically separated connecting lines.

This measure has the advantage that even the internal communication can be carried out in a redundant manner with multiple channels, as a result of which the failsafe nature of the safety switching device according to the invention is increased once more.

In a further refinement of the measure previously cited, the connecting lines are spaced apart physically from one another by a multiple of their width.

Owing to this measure, short circuits between the connecting lines, and associated fault causes, can reliably be ruled out.

In a further refinement of the measures previously cited, the connecting lines are designed to be feedback-free.

Freedom from feedback is preferably achieved by each connecting line containing a feedback-free driver stage. Owing to this measure, particularly good decoupling of the redundant signal processing channels is achieved, by which means the risk of total failure of the safety switching device according to the invention is once more considerably reduced.

In a further refinement, each of the signal processing channels has its own power supply connections, which are separated physically from the supply connections of the other signal processing channels.

With this measure, the individual signal processing channels become still more independent of one another, by which means the risk of faults which effect a plurality of signal processing channels in the same way is still further reduced. The failsafe nature of the safety switching device according to the invention is more reliably and even better ensured.

In a further refinement, the semiconductor structures of each signal processing channel form a physical group which, as a whole, is spaced apart from each physical group of each other signal processing channel.

In this refinement, the redundant signal processing channels in each case occupy their own physical area on the semiconductor substrate. It is possible for imaginary dividing lines to be drawn between the physical areas. The measure has the advantage that the individual signal processing channels are decoupled from one another in a physically optimum manner, which permits very high independence. In addition, the fault assessment and the development of the semiconductor chip are also noticeably simplified.

It goes without saying that the features cited above and those still to be explained below can be used not only in the respectively specified combination but also in other combinations or on their own without departing from the scope of the present invention.

BRIEF DESCRIPTION OF THE DRAWING

An simplified exemplary embodiment of the invention is illustrated in the drawing and will be explained in more detail in the following description.

DETAILED DESCRIPTION OF PREFERRED EMBODIMENTS

Figure 1:
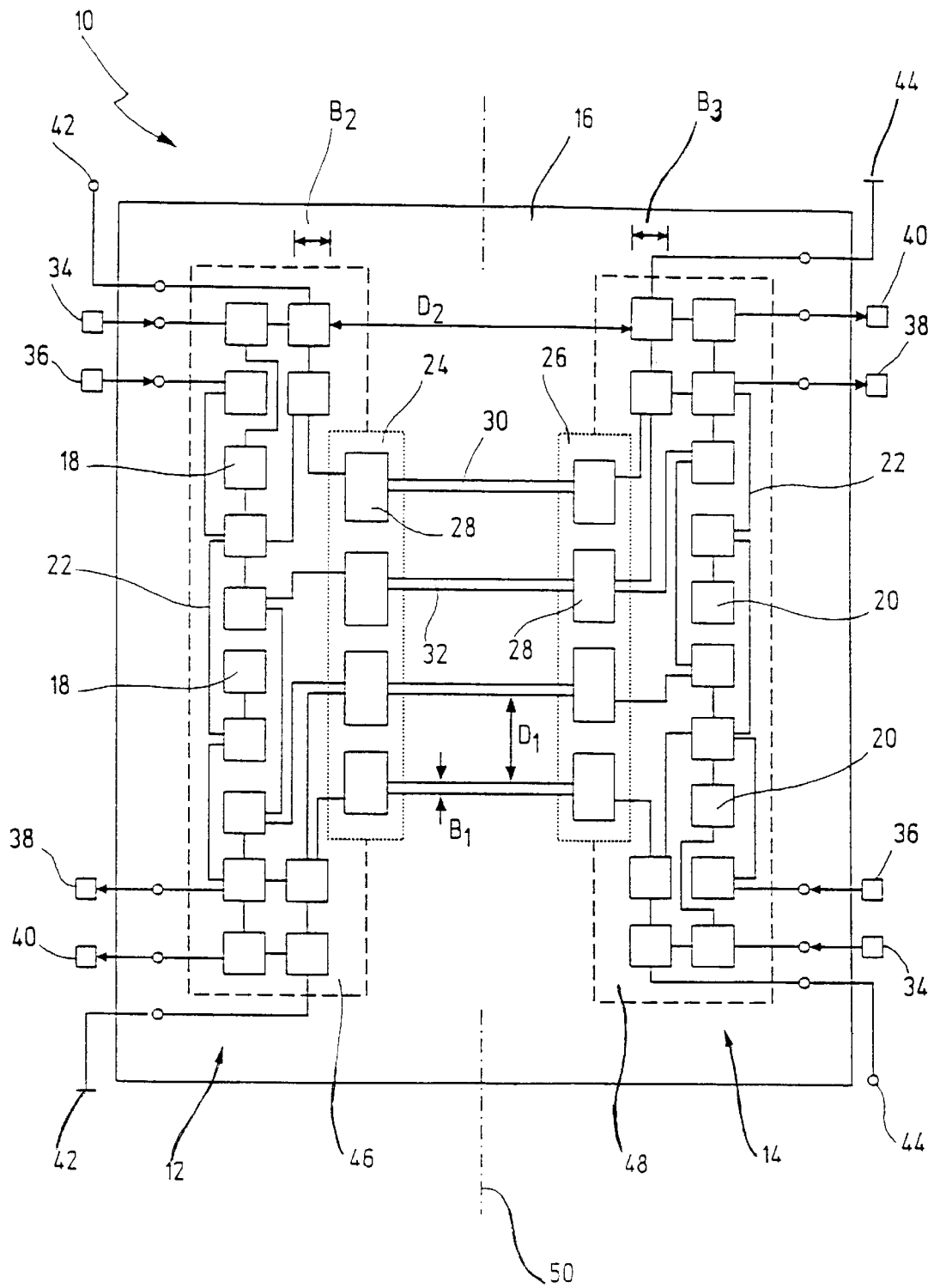

In the single FIGURE, a safety switching device according to the invention is designated overall by the reference number 10.

In the present exemplary embodiment, the safety switching device 10 has a first signal processing channel 12 and a second signal processing channel 14, which are designed redundantly in relation to each other. The two signal processing channels 12, 14 are arranged on a common semiconductor substrate 16. The safety switching device 10 is therefore implemented completely in one semiconductor chip. The semiconductor chip is potted in a dust-tight housing in a manner known per se (not illustrated here) and is therefore protected against contamination and other environmental influences.

Each signal processing channel 12, 14 contains a large number of semiconductor structures 18 and 20 which, on the semiconductor substrate 16, are connected to one another in a manner known per se by conductor tracks 22. The semiconductor structures 18, 20 are structures produced by doping in the semiconductor substrate 16 which, because of their physical arrangement, form functional islands. The functional islands in turn form electronic components, such as transistors, diodes or capacitors, in a manner known per se. As a result of the inter-connection of these components with the aid of the conductor tracks 22, an electronic circuit which forms the individual signal processing channels 12, 14 is produced.

The reference numbers 24 and 26 each designate a communication interface, via which the two signal processing channels 12, 14 can mutually carry out internal data interchange. The communication interfaces 24, 26 contain individual driver stages 28 which permit feedback-free transmission of data. The data is transmitted via chip-internal connecting lines 30, 32.

As the FIGURE illustrates, the physical spacing $D_1$ between two adjacent connecting lines 30, 32 is a multiple of the width $B_1$ of each connecting line. Depending on the intensity of the currents flowing through the connecting lines 30, 32, the spacing $D_1$ is 2 times, 3 times, 5 times or even 10 times the width $B_1$. The greater the spacing $D_1$ in relation to the width $B_1$ of the connecting lines 30, 32, the more certainly can a short circuit and/or crosstalk between the connecting lines 30, 32 be ruled out.

The spacing $D_1$ is therefore preferably selected to be more than 3 times the width $B_1$.

The reference numbers 34 and 36 designate safety sensors such as redundant contacts of an emergency off pushbutton. The safety sensors generate input signals which are supplied to the signal processing channels 12, 14 from outside via corresponding connections. In this case, the signal processing channels 12, 14 receive the input signals via separate connections, which ensures great independence of the signal processing channels 12, 14. As an alternative to this, however, it is also possible to supply the signal processing channels 12, 14 with the input signals from the sensors 34, 36 via a common connection.

The reference numbers 38, 40 designate actuators such as a relay for switching off a machine or plant. The actuators are supplied with output signals, which are provided by the signal processing channels 12 and 14 due to the signal processing. In the present exemplary embodiment, the output signals to actuators 38, 40 are also accessible via connections which are physically separated from each other, which results in great independence of the signal processing channels 12, 14. In a corresponding way, each of the signal processing channels 12, 14 in the exemplary embodiment shown here also has its own supply connections 42 and 44 for the power supply.

In accordance with the invention, the individual semiconductor structures 18 of the first signal processing channel 12 are arranged at a distance $D_2$ from the semiconductor structures 20 of the second signal processing channel 14, the distance $D_2$ being a multiple of the width $B_2$ of each semiconductor structure 18. Likewise, the distance $D_2$ is a multiple of the width $B_3$ of each semiconductor structure 20 of the second signal processing channel 14. Here, it should be noted that the semiconductor structures 18, 20 in the present figure are illustrated with the same dimensions for simplicity, although this is not absolutely necessary in practice. It goes without saying that the distance $D_2$ in this case is then respectively a multiple of the maximum width of the individual semiconductor structures 18 and 20. Here, it is again true that the failsafe nature and the separation of the redundant signal processing channels 12, 14 is ensured the more reliably the greater the ratio of the distance $D_2$ to the width of the respective semiconductor structures 18, 20 is.

In the exemplary embodiment of the invention shown here, the semiconductor structures 18 of the first signal processing channel 12 form a physical group 46 which, as a whole, is spaced apart from the physical group 48 of the semiconductor structures 20 of the second signal processing channel 14. In this way, a clear physical separation between the two signal processing channels 12 and 14 is produced on the semiconductor substrate 16. In other words, a clear dividing line 50 can be drawn here between the two signal processing channels 12 and 14. In other exemplary embodiments, the dividing line 50 can also have a curved contour.

It goes without saying that the safety switching device according to the invention can also have three or even more redundant signal processing channels 12, 14, in a departure from the exemplary embodiment shown. In this case, each of the signal processing channels is spaced apart from every other one in a corresponding way.

What is claimed is:

1. A method of fail-safely shutting down an industrial machine, the method comprising the steps of:

providing an electronic safety switching device having at least a first and a second signal processing channel, supplying the first and the second signal processing channel with input signals from a safety sensor, processing the input signals redundantly by means of the first and the second signal processing channel for generating output signals, and supplying the output signals to an actuator that interrupts the machine, wherein the first signal processing channel is constructed using first integrated semiconductor structures having a first width, and the second signal processing channel is constructed using second integrated semiconductor structures having a second width, and wherein the first and the second semiconductor structures are arranged monolithically on a common semiconductor substrate, the semiconductor structures of each signal processing channel being spaced apart physically by a multiple of their width from the semiconductor structures of every other signal processing channel.

2. The method of claim 1, wherein the first and the second semiconductor structures comprise respective first and second communication interfaces for mutual internal data interchange.

3. The method of claim 2, wherein the first and the second semiconductor structures comprise at least two physically separated connecting lines for connecting the first and second communication interfaces to each other.

4. The method of claim 3, wherein the connecting lines each comprises a line width, the connecting lines being spaced apart physically from one another by a multiple of their line width.

5. The method of claim 3, wherein the connecting lines each are designed to be feedback-free.

6. The method of claim 1, wherein the first and the second semiconductor structures comprise respective first and second power supply connections, the first and second power supply connections being physically separated from one another.

7. The method of claim 1, wherein the first and second semiconductor structures form respective first and second physical groups of semiconductor structures which groups, as a whole, are spaced apart from each other.

8. The method of claim 1, wherein the industrial machine is a press or an automatically operating robot.

9. The method of claim 1, wherein the safety sensor is an emergency off pushbutton or a protective door.

10. An electronic safety switching device having at least a first and a second signal processing channel capable of receiving input signals from a safety sensor, the first and second signal processing channels providing output signals for supplying an actuator, wherein the first and second signal processing channel are configured to process the input signals redundantly with respect to each other, wherein the first and second signal processing channels are constructed using respective first and second integrated semiconductor structures having a first and a second width, wherein the first and the second semiconductor structures are arranged monolithically on a common semiconductor substrate, and wherein the first and second semiconductor structures are spaced apart physically from one another by a multiple of their width.

11. The safety switching device of claim 10, wherein the first and second semiconductor structures comprise respective first and second communication interfaces for mutual internal data interchange.

12. The safety switching device of claim 11, wherein the first and second semiconductor structures comprise at least two physically separated connecting lines for connecting the first and second communication interfaces to each other.

13. The safety switching device of claim 12, wherein the connecting lines each comprise a line width, the connecting lines being spaced apart physically from one another by a multiple of their line width.

14. The safety switching device of claim 12, wherein the connecting lines are designed to be feedback-free.

15. The safety switching device of claim 10, wherein the first and the second semiconductor structures comprise respective first and second power supply connections, the first and second power supply connections being physically separated from one another.

16. The safety switching device of claim 10, wherein the first and second semiconductor structures form respective first and second physical groups of semiconductor structures which groups, as a whole, are spaced apart from each other.

17. An arrangement for fail-safely shutting down an industrial machine, the arrangement comprising:

a safety sensor for generating an input signal, an electronic safety switching device connected to the safety sensor for receiving the input signal, the safety switching device having at least a first and a second signal processing channel capable of redundantly processing the input signal for providing output signals, wherein the first and second signal processing channels are constructed using respective first and second integrated semiconductor structures having a first and a second width, wherein the first and the second semiconductor structures are arranged monolithically on a common semiconductor substrate, and wherein the first and second semiconductor structures are spaced apart physically from one another by a multiple of their width, and at least one actuator connected to the safety switching device for receiving the output signals and for interrupting the machine in response thereto.

18. The arrangement of claim 17, wherein the machine is a press or an automatically operating robot.

19. The arrangement of claim 17, wherein the safety sensor is an emergency off pushbutton or a protective door.

* * * * *